United States Patent
Yokota et al.

(10) Patent No.: US 10,197,797 B2
(45) Date of Patent: Feb. 5, 2019

(54) SCANNER UNIT, OPTICAL FIBER SCANNER, ILLUMINATION APPARATUS, AND OBSERVATION APPARATUS

(71) Applicant: OLYMPUS CORPORATION, Tokyo (JP)

(72) Inventors: Hirokazu Yokota, Tokyo (JP); Yasuaki Kasai, Saitama (JP); Hiroshi Tsuruta, Kanagawa (JP); Yoshiro Okazaki, Tokyo (JP); Kazutoshi Kumagai, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 35 days.

(21) Appl. No.: 15/275,367

(22) Filed: Sep. 24, 2016

(65) Prior Publication Data

US 2017/0010462 A1    Jan. 12, 2017

Related U.S. Application Data

(63) Continuation of application No. PCT/JP2015/053198, filed on Feb. 5, 2015.

(30) Foreign Application Priority Data

Apr. 17, 2014  (JP) ................. 2014-085457

(51) Int. Cl.
   *G02B 23/24*   (2006.01)
   *G02B 26/10*   (2006.01)
   (Continued)

(52) U.S. Cl.
   CPC ....... *G02B 26/103* (2013.01); *G02B 23/2469* (2013.01); *G02B 26/10* (2013.01); *H01L 41/0926* (2013.01); *H01L 41/313* (2013.01)

(58) Field of Classification Search
   CPC .. G02B 23/2469; G02B 26/10; G02B 26/103; H01L 41/09; H01L 41/313
   See application file for complete search history.

(56) References Cited

U.S. PATENT DOCUMENTS 7,129,472 B1 * 10/2006 Okawa ............... A61B 1/00059
                                                  250/216
8,922,781 B2 * 12/2014 Tearney ............... A61B 5/0066
                                                  356/479

(Continued)

FOREIGN PATENT DOCUMENTS

EP    0 847 136 A2    6/1998
EP    2 905 648 A1    8/2015
(Continued)

OTHER PUBLICATIONS

International Search Report dated Mar. 31, 2015 issued on PCT/JP2015/053198.

*Primary Examiner* — Tsion Tumebo
(74) *Attorney, Agent, or Firm* — Scully, Scott, Murphy & Presser, P.C.

(57) ABSTRACT

A scanner unit includes: a tubular elastic part provided with marks outside a prescribed bonding region set on an outer surface thereof and; and a piezoelectric element that is bonded to the bonding region. The piezoelectric element includes: a piezoelectric body having two mutually opposing electrode faces; and marks that are different from each other, respectively provided on the two electrode faces. The mark provided on one electrode face has a shape that matches the mark provided outside the bonding region when the piezoelectric body is bonded to the bonding region so that the other electrode face contacts the outer surface.

11 Claims, 7 Drawing Sheets

(51) Int. Cl.
*H01L 41/09* (2006.01)
*H01L 41/313* (2013.01)

(56) References Cited

U.S. PATENT DOCUMENTS

| | | | | |
|---|---|---|---|---|
| RE45,512 E | * | 5/2015 | Tearney | A61B 5/0066 385/100 |
| 2004/0254474 A1 | * | 12/2004 | Seibel | A61B 5/0062 600/473 |
| 2006/0195014 A1 | * | 8/2006 | Seibel | A61B 1/0008 600/102 |
| 2007/0171425 A1 | * | 7/2007 | De Groot | G03F 7/70775 356/478 |
| 2010/0168515 A1 | | 7/2010 | Sugimoto | |
| 2012/0080612 A1 | * | 4/2012 | Grego | A61B 1/0008 250/458.1 |
| 2013/0241360 A1 | | 9/2013 | Nishimura et al. | |
| 2014/0114131 A1 | * | 4/2014 | Sakai | G02B 21/0028 600/182 |
| 2015/0205050 A1 | | 7/2015 | Funakubo et al. | |

FOREIGN PATENT DOCUMENTS

| | | |
|---|---|---|
| JP | 8-164608 A | 6/1996 |
| JP | 10-173477 A | 6/1998 |
| JP | 2000-196160 A | 7/2000 |
| JP | 2002-84008 A | 3/2002 |
| JP | 2002-190457 A | 7/2002 |
| JP | 2004-80948 A | 3/2004 |
| JP | 2010-148764 A | 7/2010 |
| JP | 2013-244045 A | 12/2013 |
| WO | WO 2012/073623 A1 | 6/2012 |
| WO | WO 2014/054524 A1 | 4/2014 |

* cited by examiner

FIG. 9

SCANNER UNIT, OPTICAL FIBER SCANNER, ILLUMINATION APPARATUS, AND OBSERVATION APPARATUS

CROSS-REFERENCE TO RELATED APPLICATIONS

This is a continuation of International Application PCT/JP2015/053198, with an international filing date of Feb. 5, 2015, which is hereby incorporated by reference herein in its entirety. This application claims the benefit of Japanese Patent Application No. 2014-085457, the content of which is incorporated herein by reference.

TECHNICAL FIELD

The present invention relates to a scanner unit, an optical fiber scanner, an illumination apparatus, and an observation apparatus.

TECHNICAL FIELD

In the related art, there are known optical fiber scanners provided with a quadrangular tube-shaped elastic part, which holds an optical fiber in a cantilevered fashion, and actuators provided on the four outer surfaces of the elastic part (for example, see Patent Literature 1). The actuators are formed of plate-like piezoelectric elements that have been subjected to polarization treatment in the thickness directions thereof, so that the front faces of the piezoelectric elements are positive poles and the rear faces thereof are negative poles. When an alternating voltage is applied to a piezoelectric element in the thickness direction across the front face and rear face, the piezoelectric element undergoes a stretching vibration in the longitudinal direction of the optical fiber, thereby exciting a bending vibration in the elastic part and the optical fiber. Accordingly, the distal end of the optical fiber, which is a free end, is oscillated along a prescribed path, and the light emitted from the distal end can be scanned.

CITATION LIST

Patent Literature

{PTL1}
Japanese Unexamined Patent Application, Publication No. 2013-244045

SUMMARY OF INVENTION

Technical Problem

The present invention provides a scanner unit, an optical fiber scanner, an illumination apparatus, and an observation apparatus in which an optical fiber scanner that always has stable performance can be manufactured.

Solution to Problem

The present invention provides the following solutions.

A first aspect of the present invention is a scanner unit comprising: a tubular elastic part on which a prescribed bonding region is set on an outer face thereof and which is provided with a first mark on the outer side of the prescribed bonding region; and a piezoelectric element that is bonded to the prescribed bonding region on the elastic part and that excites a bending vibration in a direction intersecting a length direction of the elastic part, wherein the piezoelectric element includes a piezoelectric body having two mutually opposing electrode faces and that is polarized in the opposing direction of the two electrode faces, and mutually differing second marks, respectively provided on the two electrode faces of the piezoelectric body, wherein the second marks provided on one of the two electrode faces has a shape that matches the first mark provided on the outer side of the bonding region when the piezoelectric body is bonded to the prescribed bonding region on the outer surface so that the other of the two electrode faces contacts the outer surface.

A second aspect of the present invention is an optical fiber scanner comprising: the above-described scanner unit; and an optical fiber that is inserted in the longitudinal direction inside the elastic part.

A third aspect of the present invention is an illumination apparatus comprising: the above-described optical fiber scanner; a light source that is disposed at a base end of the optical fiber scanner and that supplies illumination light to the optical fiber; an illumination lens that is disposed at the distal end of the optical fiber scanner and that focuses light emitted from the distal end of the optical fiber onto a subject; and a long, thin outer tube that accommodates the optical fiber scanner and the illumination lens.

A fourth aspect of the present invention is an observation apparatus comprising: the above-described illumination apparatus; and a light detecting portion that detects return light returning from the subject in response to the subject being irradiated with light by the illumination apparatus.

BRIEF DESCRIPTION OF DRAWINGS

FIG. 9 is a graph for explaining combinations of the mark provided on the piezoelectric element and a mark provided on the elastic part.

DESCRIPTION OF EMBODIMENT

Piezoelectric elements 1 and a scanner unit 10 provided with the same according to an embodiment of the present invention will be described below with reference to the drawings.

Figure 1A:
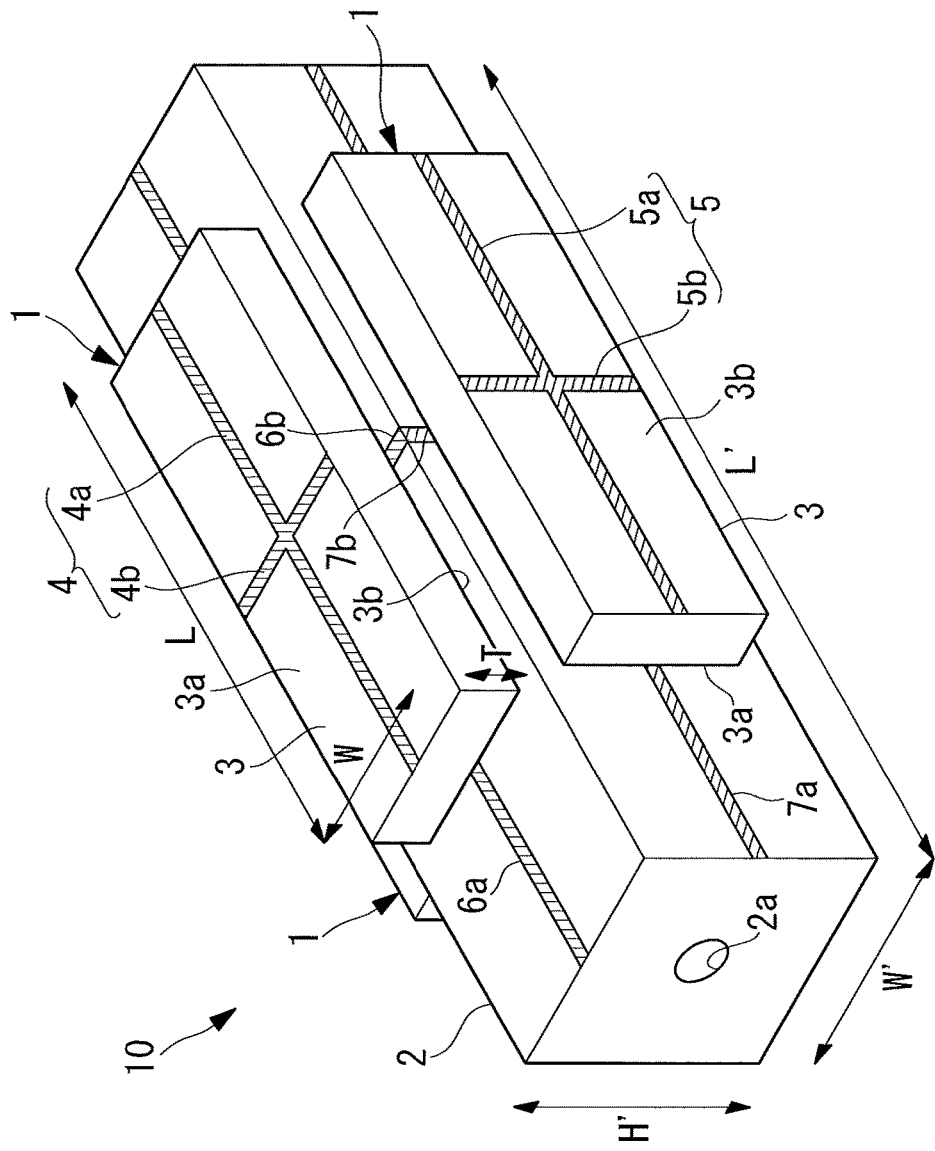
FIG. 1A is a perspective view of a scanner unit according to an embodiment of the present invention.
Figure 1B:
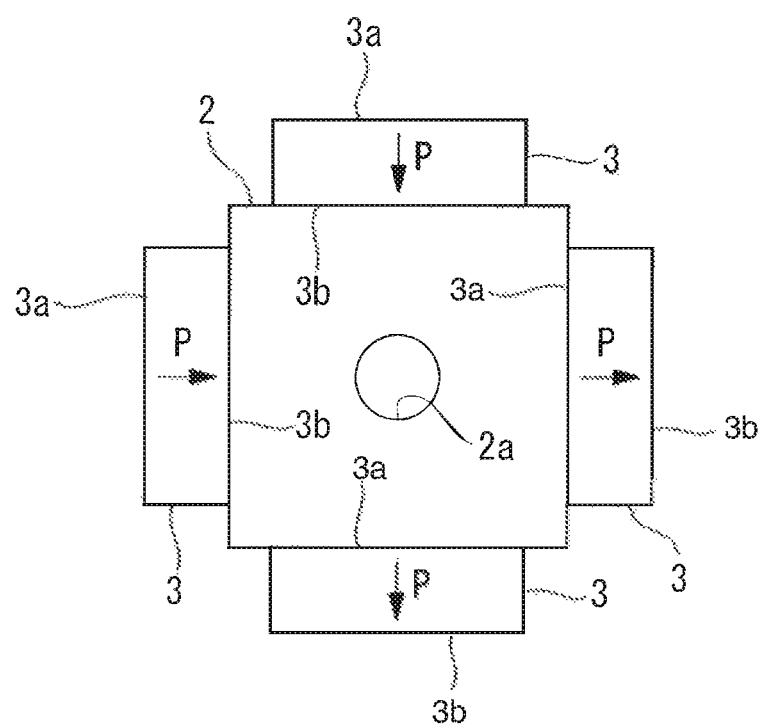
FIG. 1B is a front view of the scanner unit in FIG. 1A, taken along the longitudinal direction.

As shown in FIG. 1A and FIG. 1B, the scanner unit 10 according to this embodiment includes the piezoelectric elements 1 and an elastic part 2 to which the piezoelectric elements 1 are bonded.

The piezoelectric elements 1 each include: a piezoelectric body 3 formed of a rectangular plate-like member; and marks (second marks) 4 and 5 provided on outer surfaces of the piezoelectric body 3.

The piezoelectric bodies 3 are formed of a piezoelectric ceramic material, such as lead zirconate titanate (PZT). The piezoelectric bodies 3 have a length direction L, a width direction W, and a thickness direction T that are mutually orthogonal. The piezoelectric bodies 3 each have a front face 3a and a rear face 3b that oppose each other in the thickness direction. The piezoelectric bodies 3 are subjected to polarization treatment so that the front faces (electrode faces) 3a are positive poles, and the rear faces (electrode faces) 3b are negative poles, and are thereby polarized in the thickness direction T, as shown by the arrows P.

The mark 4, having a first color and formed of a straight line (hereinafter referred to as longitudinal line) 4a parallel to the length direction L and a straight line (hereinafter referred to as lateral line) 4b parallel to the width direction W, is provided on the front face 3a. The longitudinal line 4a connects the two edges of the front face 3a that oppose each other in the length direction L. The lateral line 4b connects the two edges of the front face 3a that oppose each other in the width direction W.

The mark 5, having a second color that is different from the first color and formed of a straight line (hereinafter referred to as longitudinal line) 5a that is parallel to the length direction L and a straight line (hereinafter referred to as lateral line) 5b that is parallel to the width direction W, is provided on the rear face 3b. The longitudinal line 5a joins the two edges of the rear face 3b that oppose each other in the length direction L. The lateral line 5b joins the two edges of the rear face 3b that oppose each other in the width direction W.

The elastic part 2 is a quadrangular-tube shaped member formed of a metal having electrical conductivity and elasticity, for example, nickel, copper, or the like. The elastic part 2 has a length direction L', a width direction W', and a height direction H' that are mutually orthogonal. The elastic part 2 has a through-hole 2a that is formed along a central axis in the length direction L' from a distal end face to a base end face and into which an optical fiber is inserted.

Marks (first marks) 6 each formed of a straight line (hereinafter referred to as longitudinal line) 6a parallel to the length direction L' and a straight line (hereinafter referred to as lateral line) 6b parallel to the width direction W' and marks (first marks) 7 each formed of a straight line (hereinafter referred to as longitudinal line) 7a parallel to the length direction L' and a straight line (hereinafter referred to as lateral line) parallel to the height direction H' are provided on the four outer surfaces possessed by the elastic part 2. The longitudinal lines 6a and 7a connect the two edges of the outer surfaces, which edges oppose each other in the length direction L'. The lateral line 6b connects the two edges that oppose each other in the width direction W', and the lateral line 7b connects the two edges that oppose each other in the height direction H'.

Of two mutually opposing outer surfaces, one is provided with the mark 6 of a first color that is the same as that of the mark 4 on the front face 3a, and the other is provided with the mark 7 of a second color that is the same as that of the mark 5 on the rear face 3b. Similarly, of the two remaining outer surfaces, one is provided with the mark 6 of the first color that is the same as that of the mark 4 on the front face 3a, and the other is provided with the mark 7 of the second color which is the same as that of the mark 5 on the rear face 3b.

Figure 2:
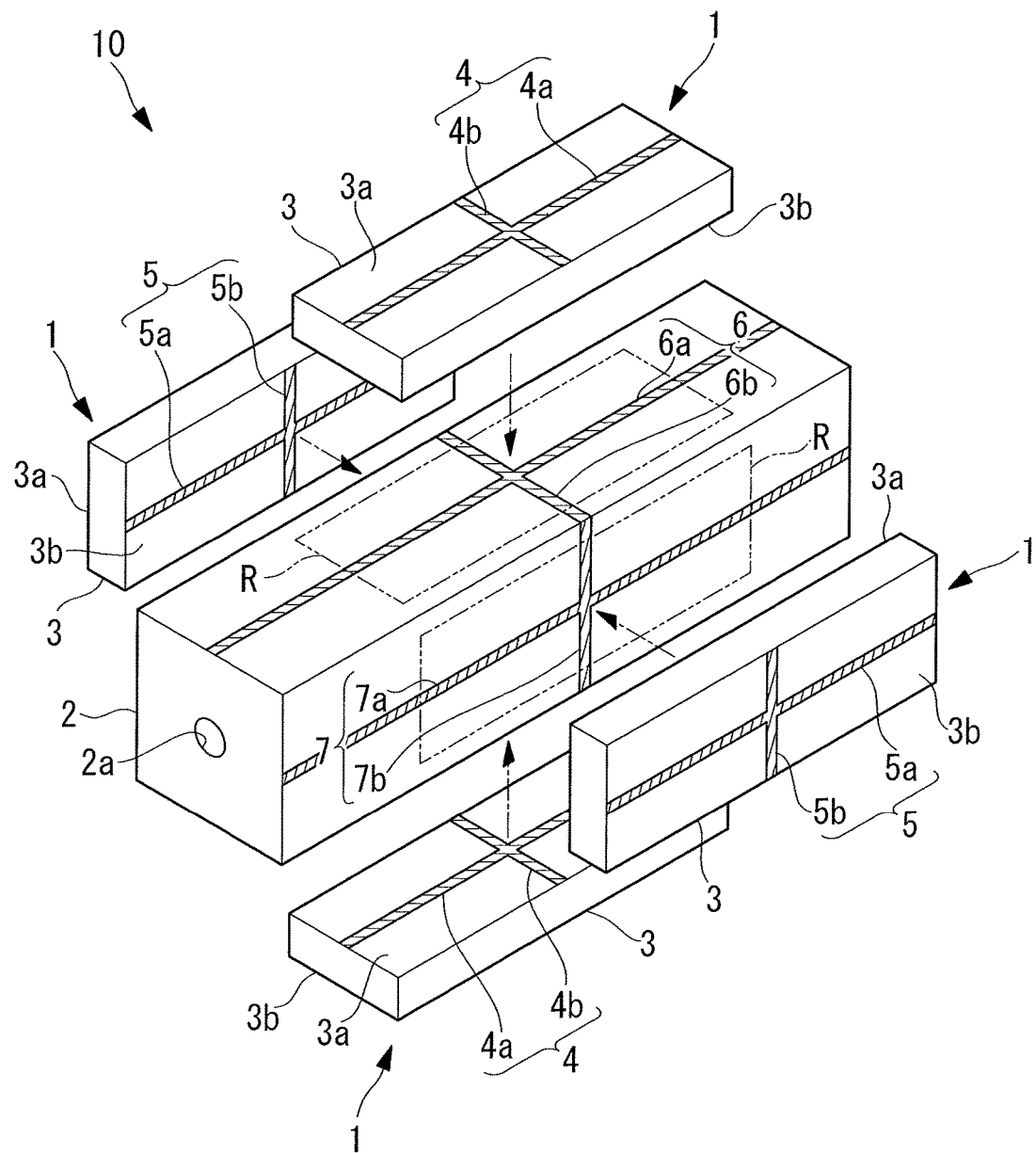
FIG. 2 is an exploded perspective view of the scanner unit in FIG. 1A.

As shown in FIG. 2, the piezoelectric elements 1 are bonded to a prescribed bonding region R set on each outer surface of the elastic part 2. The prescribed bonding regions R are regions where a bending vibration can be excited in the elastic part 2 due to a stretching vibration in the length direction of the piezoelectric element 1, when an alternating voltage, to be described later, is applied to the piezoelectric elements 1 bonded to the prescribed bonding regions R.

Here, the piezoelectric elements 1 are bonded to the corresponding outer surfaces of the elastic part 2 so that, when the outer surfaces are viewed from the front thereof, the colors of the marks 6 and 7 on those outer surfaces and the colors of the marks 4 and 5 on the piezoelectric elements 1 on those outer surfaces are the same. Furthermore, the positions of the marks 4, 5, 6, and 7 are designed so that, when the outer surfaces are viewed from the front thereof, the longitudinal lines 4a and 6a form a single straight line, and the lateral lines 4b and 6b form a single straight line, or so that the longitudinal lines 5a and 7a form a single straight line, and the lateral lines 5b and 7b form a single straight line.

Next, the method of assembling the scanner unit 10 configured in this way will be described.

To assemble the scanner unit 10 according to this embodiment, of the four outer surfaces of the elastic part 2, one piezoelectric 1 is bonded to each of two mutually opposing outer surfaces using an electrically conductive adhesive.

Specifically, the piezoelectric elements 1 are bonded so that, for one outer surface on which the mark 6 of the first color is provided, the rear face 3b on which the mark 5 of the second color is provided contacts that outer surface. At this time, the positions and angles of the piezoelectric elements 1 in the length direction L' and the width direction W' relative to the outer surfaces are adjusted so that the longitudinal lines 4a and 6a form a single straight line, and the lateral lines 4b and 6b form a single straight line.

Also, the piezoelectric elements 1 are bonded so that, for the other outer surface on which the mark 7 of the first color is provided, the front face 3b on which the mark 4 of the first color is provided contacts that outer surface. At this time, the positions and angles of the piezoelectric elements 1 in the length direction L' and the height direction H' relative to the outer surfaces are adjusted so that the longitudinal lines 5a and 7a form a single straight line, and the lateral lines 5b and 7b form a single straight line.

With the above procedure, as shown in FIG. 1B, the piezoelectric elements 1 are bonded to the elastic part 2 so that the polarization directions P of the piezoelectric elements 1 provided on mutually opposing outer surfaces of the elastic part 2 are the same.

Similarly, the scanner 10 can be completed by bonding one piezoelectric element 1 to each of the two remaining outer surfaces of the elastic member 2.

Thus, with this embodiment, on the basis of the colors of the marks 4 and 5 provided on the respective faces 3a and 3b of the piezoelectric elements 1 and the colors of the marks 6 and 7 provided on the respective outer surfaces of the elastic part 2, it is possible to bond the piezoelectric elements 1 to the corresponding outer surfaces without mistaking the front/rear surfaces. Also, on the basis of the longitudinal lines 4a and 5a and the lateral lines 4b and 5b provided on the corresponding faces 3a and 3b of the piezoelectric elements 1 and the longitudinal lines 6a and 7a and the lateral lines 6b and 7b provided on the corresponding outer surfaces of the elastic part 2, the positions of the piezoelectric elements 1 on the outer surfaces can be arbitrarily specified in the prescribed bonding regions, and the piezoelectric elements 1 can be bonded to the bonding regions R with accurate positional alignment. By doing so, it is possible to assemble the scanner unit 10 without assembly errors, and therefore, an advantage is afforded in that a scanner unit 10 that always has constant oscillating performance in the elastic part 2 can be obtained.

Next, an optical fiber scanner 20, an illumination apparatus 30, and an observation apparatus 40 according to an embodiment of the present invention will be described. In the following description, the height direction H' of the elastic part 2 is defined as the X direction, the width direction is defined as the Y direction, and the length direction L' is defined as the Z direction.

Figure 3:
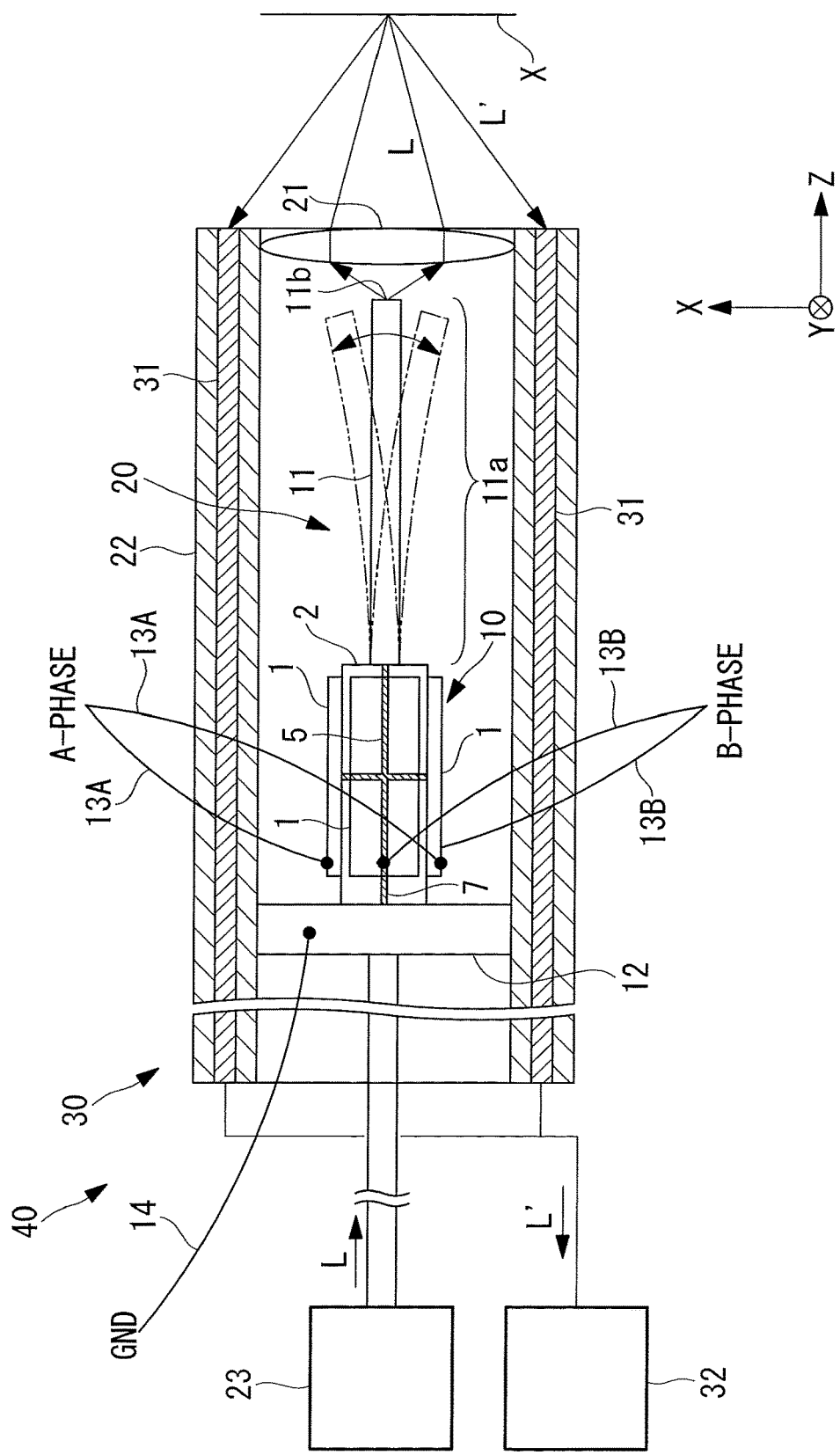
FIG. 3 is a diagram showing the overall configuration of an observation apparatus according to an embodiment of the present invention.

As shown in FIG. 3, the observation apparatus 40 according to this embodiment includes the illumination apparatus 30, which radiates illumination light L onto the surface of the subject X, and a detection optical fiber 31 and light detector (light detecting portion) 32 for detecting return light L' of the illumination light from the subject X.

The illumination apparatus 30 includes the optical fiber scanner 20; an illumination lens 21 disposed at the distal end of the optical fiber scanner 20; a long, thin, cylindrical outer tube 22 that accommodates the optical fiber scanner 20 and the illumination lens 21; and a light source 23.

The optical fiber scanner 20 includes the scanner unit 10, the optical fiber 11, and a fixing portion 12.

The optical fiber 11 has a long, thin, circular rod shape and is formed of a glass material. The optical fiber 11 is inserted into the through-hole 2a in the elastic part 2 so that the distal end portion thereof protrudes, and the inner circumferential surface of the through-hole 2a and the outer surface of the optical fiber are fixed to each other. In the following, the portion of the optical fiber that protrudes towards the distal end from the elastic part 2 is called a light scanning portion 11a.

The fixing portion 12 is a cylindrical member formed of a metal material, such as stainless steel. The inner circumferential surface of the fixing portion 12 is fixed to the outer surface at the base end portion of the elastic part 2. The outer surface of the fixing portion 12 is fixed to the inner circumferential surface of the outer tube 22.

A-phase lead lines 13A are connected to the two piezoelectric elements 1 that oppose each other in the X direction by using solder or an electrically conductive adhesive. B-phase lead lines 13B are connected to the remaining two piezoelectric elements 1 that oppose each other in the Y direction by using solder or an electrically conductive adhesive. A GND (ground) lead line 14 is connected to the fixing portion 12 by using solder or an electrically conductive adhesive, so that the fixing portion 12 functions as a common GND for the four piezoelectric elements 1.

The illumination lens 21 is disposed so that the back focal position thereof is approximately aligned with the distal end 11b of the optical fiber 11, and illumination light L emitted from the distal end 11b of the optical fiber is focused on a subject X.

The light source 23 is connected to the base end of the optical fiber 11, at the base end of the outer tube 22, and supplies the illumination light L to the base end of the optical fiber 11.

A plurality of detection optical fibers 31 are provided in an array around the circumferential direction at the outer side of the optical fiber scanner 20, inside the outer tube 22. The distal end faces of the detection optical fibers 31 are disposed at the distal end face of the outer tube 22.

A light detector 32 is disposed at the base end of the outer tube 22 and is connected to the base ends of the detection optical fibers 31.

Next, the operation of the optical fiber scanner 20, the illumination apparatus 30, and the observation apparatus 40 configured in this way will be described.

To observe the subject X using the observation apparatus 40 according to this embodiment, the illumination light L is supplied to the optical fiber 11 from the light source 23, and the distal end 11b of the optical fiber 11 is made to oscillate by applying alternating voltages to the piezoelectric elements 1 via the lead lines 13A and 13B.

Specifically, an A-phase alternating voltage having a frequency that corresponds to the bending resonance vibration frequency of the light scanning portion 11a is applied to the piezoelectric elements 1 via the lead lines 13A. Accordingly, the piezoelectric elements 1 undergo stretching vibrations in the Z direction orthogonal to the polarization directions P thereof. At this time, of these two piezoelectric elements 1, one contracts in the Z direction, and the other expands in the Z direction, whereby a bending vibration in the X direction is excited in the elastic part 2. Then, the bending vibration in the elastic part 2 is transferred to the optical fiber 11, whereby the light scanning portion 11a undergoes bending vibrations in the X direction, and the light emitted from the distal end 11b is scanned in a straight line in the X direction.

Similarly, a B-phase alternating voltage having a frequency corresponding to the bending resonance vibration frequency of the light scanning portion 11a is applied to the piezoelectric elements 1 via the lead lines 13B. Accordingly, the piezoelectric elements 1 undergo stretching vibrations in the Z direction orthogonal to the polarization directions P thereof. At this time, of these two piezoelectric elements 1, one contracts in the Z direction, and the other expands in the Z direction, whereby a bending vibration in the Y direction is excited in the elastic part 2. Then, the bending vibration in the elastic part 2 is transferred to the optical fiber 11, whereby the light scanning portion 11a undergoes bending vibrations in the Y direction, and the light emitted from the distal end 11b is scanned in a straight line in the Y direction.

Here, the phase of the A-phase alternating voltage and the phase of the B-phase alternating voltage are shifted from each other by $\pi/2$, and the amplitudes of the A-phase alternating voltage and the B-phase alternating voltage are varied sinusoidally, whereby the distal end 11b of the optical fiber 11 oscillates along a spiral path, and the illumination light L is two-dimensionally scanned along a spiral path on the subject X. Return light L' of the illumination light L from the subject X is received by the plurality of detection optical fibers 31, and the intensity thereof is detected by the light detector 32. The observation apparatus 40 detects the return light L' with the light detector 32 in synchronization with the scanning period of the illumination light L, and the intensity of the detected return light L' is associated with the scanning position of the illumination light L, thereby generating an image of the subject X.

In this case, according to this embodiment, since the scanner unit in which the elastic part 2 has constant oscillation performance is provided, the bending resonance vibrations of the light scanning portion 11a excited by the bending vibrations of the elastic part 2 are also constant, and there is no difference in scanning performance of the illumination light L among different optical fibers scanners 20. Accordingly, an advantage is afforded in that it is possible to manufacture optical fiber scanners 20, illumination apparatuses 30, and observation apparatuses 40 having the same scanning performance.

In this embodiment, it has been described that the mark 4 on the front face 3a of the piezoelectric element 1 and the mark 5 on the rear face 3b have the same shape as each other and different colors from each other; instead of this, however, the mark 4 on the front face 3a and the mark 5 on the rear face 3b may have different shapes from each other. In this case, the colors of the two marks 4 and 5 may be the same as each other or may be different from each other. By doing so, it is possible to distinguish the polarity of each of the faces 3a and 3b of the piezoelectric element 1 on the basis of the shapes of the marks 4 and 5.

Figure 4:
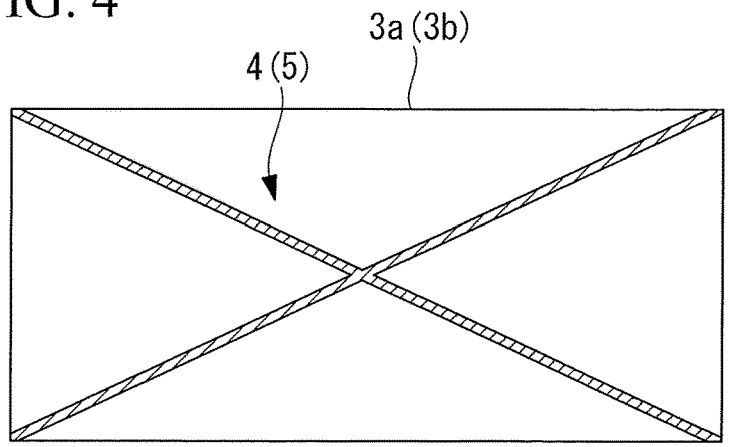
FIG. 4 is a plan view of a piezoelectric element showing an example shape of a mark.
Figure 5:
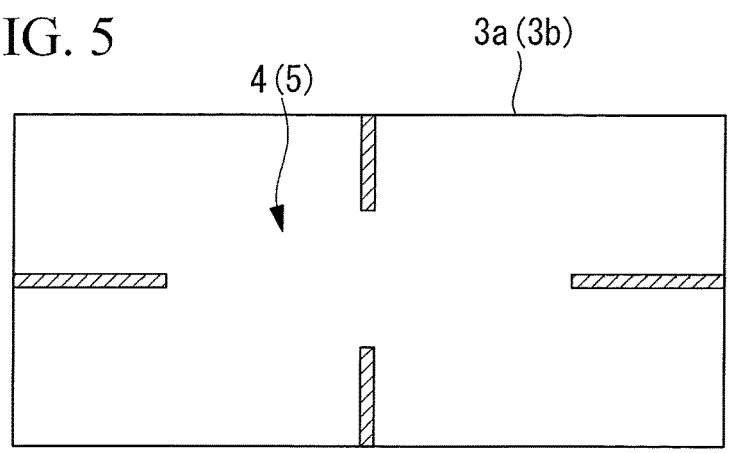
FIG. 5 is a plan view of the piezoelectric element showing another example shape of the mark.
Figure 6:
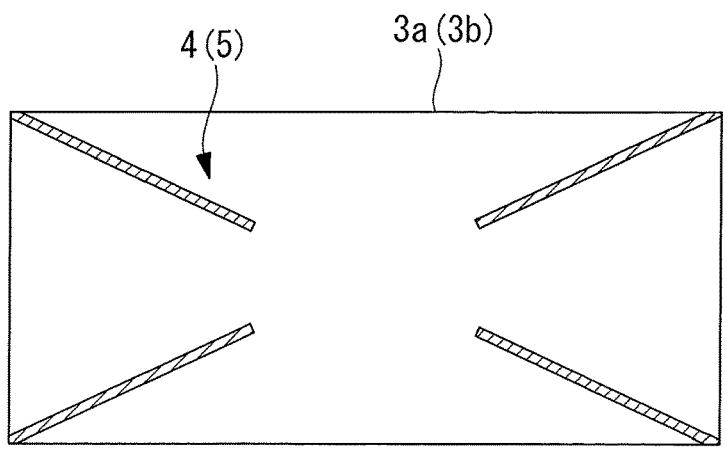
FIG. 6 is a plan view of the piezoelectric element showing another example shape of the mark.
Figure 7:
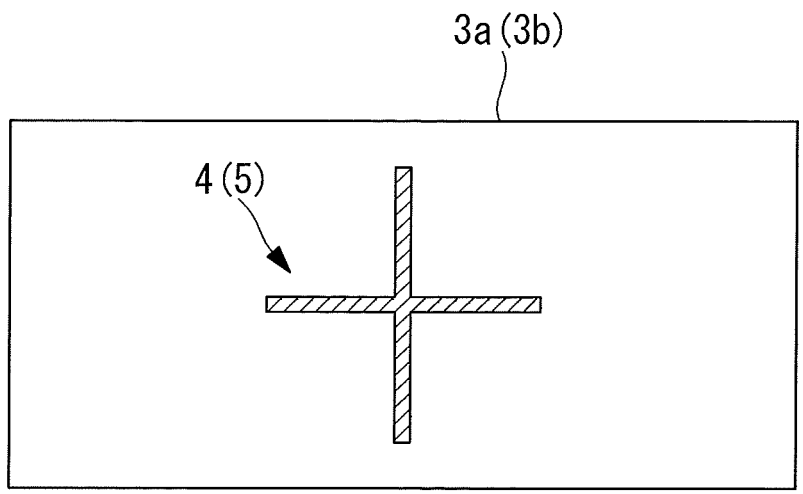
FIG. 7 is a plan view of the piezoelectric element showing another example shape of the mark.
Figure 8:
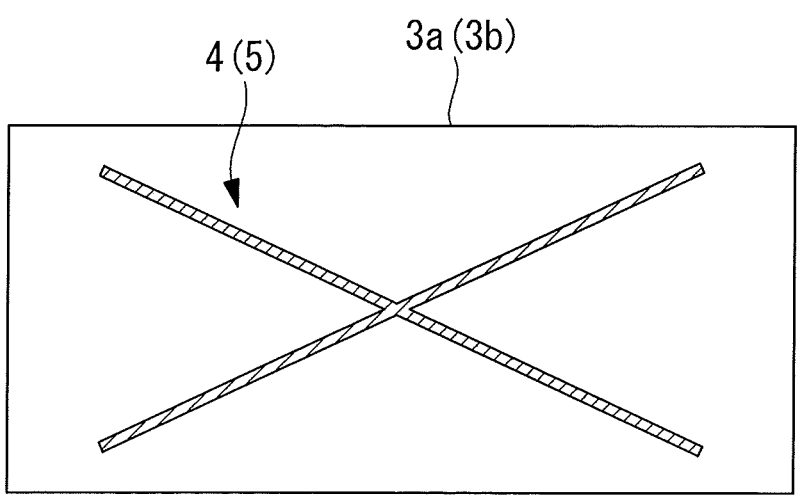
FIG. 8 is a plan view of the piezoelectric element showing another example shape of the mark.

FIGS. 4 to 8 show modifications of the shapes of the marks 4 and 5. As shown in FIG. 4, the marks 4 and 5 may be formed of two diagonal lines that join the corners of each of the faces 3a and 3b. Also, as shown in FIGS. 5 and 6, the two lines of the marks 4 and 5, may have intermediate portions removed so as to be discontinuous. Additionally, the ends of the two lines in the marks 4 and 5 preferably contact the respective four edges of the front face 3a or the rear face 3b; however, as shown in FIGS. 7 and 8, the ends of the lines may be positioned away from the edges.

Figure 9:
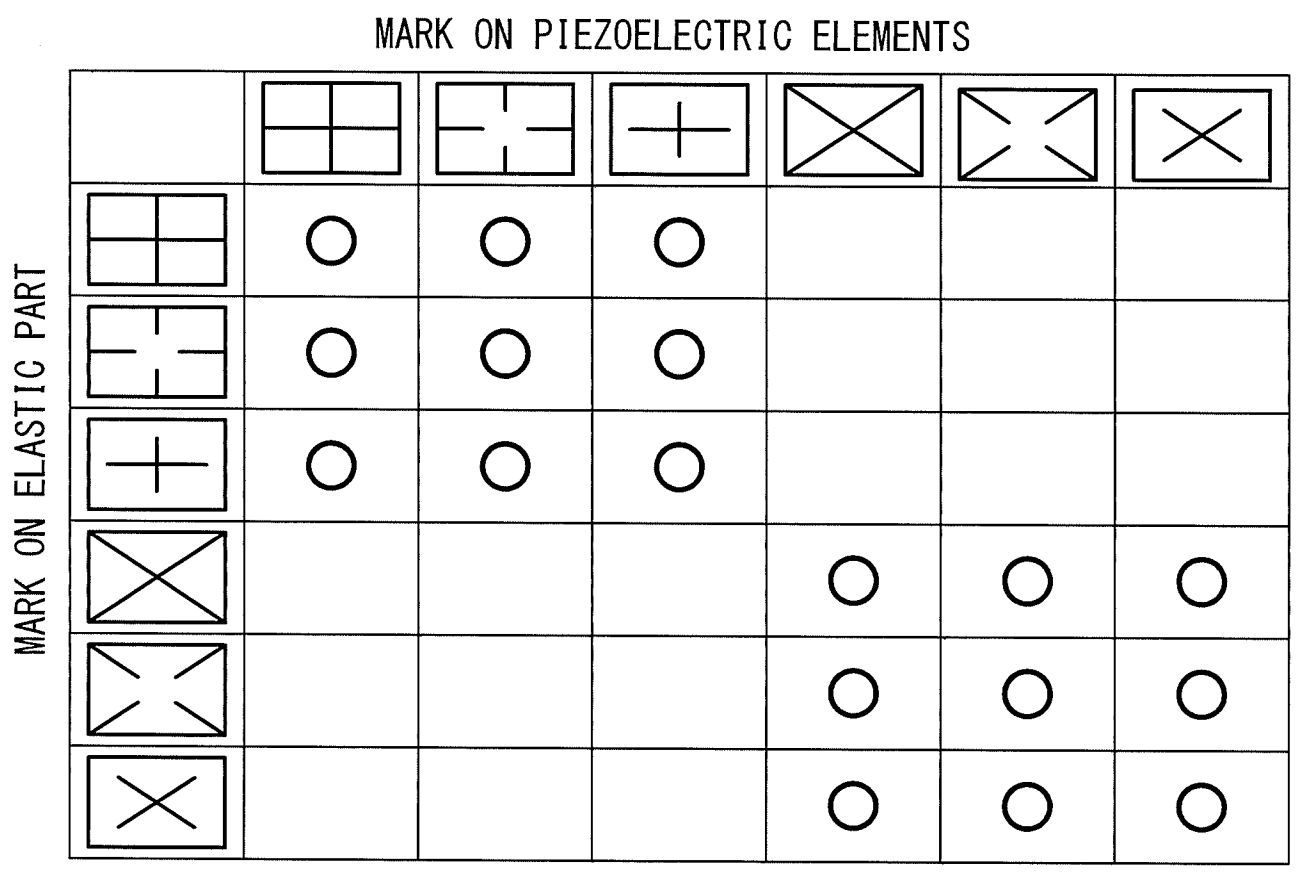

The shapes of the marks 6 and 7 on the elastic part 2 are also appropriately modified according to the shapes of the marks 4 and 5 on the piezoelectric element 1. FIG. 9 shows examples of combinations of the marks 4 and 5 on the piezoelectric element 1 and the marks 6 and 7 on the elastic part 2. In FIG. 9, the combinations provided with the circles indicate usable combinations. The marks 6 and 7 on the elastic part 2 can also be modified in the same way as the marks 4 and 5 on the piezoelectric element 1 shown in FIGS. 4 to 8. Thus, the marks 4 and 5 on the piezoelectric element 1 and the marks 6 and 7 on the elastic part 2 should have shapes that match each other, and preferably, should have shapes that are continuous with each other in at least two directions, when the piezoelectric element 1 is disposed on the prescribed bonding region R on the outer surface of the elastic part 2.

As a result, the above-described embodiment leads to the following aspects.

A first aspect of the present invention is a scanner unit comprising: a tubular elastic part on which a prescribed bonding region is set on an outer face thereof and which is provided with a first mark on the outer side of the prescribed bonding region; and a piezoelectric element that is bonded to the prescribed bonding region on the elastic part and that excites a bending vibration in a direction intersecting a length direction of the elastic part, wherein the piezoelectric element includes a piezoelectric body having two mutually opposing electrode faces and that is polarized in the opposing direction of the two electrode faces, and mutually differing second marks, respectively provided on the two electrode faces of the piezoelectric body, wherein the second marks provided on one of the two electrode faces has a shape that matches the first mark provided on the outer side of the bonding region when the piezoelectric body is bonded to the prescribed bonding region on the outer surface so that the other of the two electrode faces contacts the outer surface.

With the first aspect of the present invention, when an alternating voltage is applied across the electrode faces of the piezoelectric body, the piezoelectric body undergoes a stretching vibration in a direction intersecting the polarization direction, in other words, in the length direction of the elastic part, whereby a bending vibration is excited in the elastic part. This bending vibration is transferred to the optical fiber inserted in the elastic part, whereby the distal end of the optical fiber can be oscillated, and the light emitted from the distal end can be scanned.

In this case, since the second marks having different colors from each other are provided on the two electrode faces, the polarity of each electrode face can be distinguished, and the piezoelectric body can be bonded to the outer surface of the elastic part in the proper orientation.

Furthermore, when the piezoelectric body is to be bonded to the outer surface so that one of the electrode faces contacts the outer surface of the elastic part, the piezoelectric body is positioned so that the second mark provided on the other electrode face disposed at the outer side matches the first mark provided on the outer surface, whereby the piezoelectric body is correctly positionally aligned in the prescribed bonding region on the outer surface. Accordingly, the bending vibrations excited in the elastic part and the optical fiber by driving the piezoelectric body are constant, without exhibiting any individual differences, and therefore, it is possible to manufacture an optical fiber scanner that always has stable performance.

In the first aspect described above, the second marks provided on the two electrode faces may have different colors and/or shaped from each other.

By doing so, it is possible to easily distinguish the polarity of the each electrode face of the piezoelectric body on the basis of the colors or shapes of the second marks.

In the first aspect described above, the second marks may be formed of two straight lines that extend in directions intersecting each other. For example, the two electrode faces may be rectangular, and the two straight lines may be respectively parallel to a length direction and a width direction of the electrode faces. Alternatively, the two electrode faces may be rectangular, and the two straight lines may be diagonal lines that join the corners of the electrode faces.

By doing so, it is possible to improve the positioning precision of the piezoelectric body in two axial directions while still having second marks with simple shapes.

In the first aspect described above, the ends of the two straight lines may each contact an edge of the electrode faces.

By doing so, it is possible to improve the positioning precision of the second marks on the piezoelectric body relative to the first mark on the elastic part.

A second aspect of the present invention is an optical fiber scanner comprising: the above-described scanner unit; and an optical fiber that is inserted in the longitudinal direction inside the elastic part.

A third aspect of the present invention is an illumination apparatus comprising: the above-described optical fiber scanner; a light source that is disposed at a base end of the optical fiber scanner and that supplies illumination light to the optical fiber; an illumination lens that is disposed at the distal end of the optical fiber scanner and that focuses light emitted from the distal end of the optical fiber onto a subject; and a long, thin outer tube that accommodates the optical fiber scanner and the illumination lens.

A fourth aspect of the present invention is an observation apparatus comprising: the above-described illumination apparatus; and a light detecting portion that detects return light returning from the subject in response to the subject being irradiated with light by the illumination apparatus.

The present invention affords an advantage in that it is possible to manufacture an optical scanner that always has stable performance.

REFERENCE SIGNS LIST 1 piezoelectric element
2 elastic part
2a through-hole
3 piezoelectric body
3a front face (electrode face)
3b rear face (electrode face)
4, 5 mark (second mark)
4a, 5a longitudinal line
4b, 5b lateral line
6, 7 mark (first mark)
10 scanner unit
11 optical fiber
11a light scanning portion
12 fixing portion
13A, 13B lead line
14 GND lead line
20 optical fiber scanner
21 illumination lens
22 outer tube
23 light source
30 illumination apparatus
31 detection optical fiber
32 light detector
40 observation apparatus
L illumination light
L' return light
X subject

The invention claimed is:

1. A scanner unit comprising:
a tubular elastic part on which a prescribed bonding region is set on an outer face thereof, the tubular elastic part having a first mark on the outer surface of the prescribed bonding region; and
a piezoelectric element that is bonded to the prescribed bonding region on the elastic part and that excites a bending vibration in a direction intersecting a length direction of the elastic part, wherein the piezoelectric element includes:
a piezoelectric body having first and second electrode faces, the first and second electrode faces opposing each other and having opposite polarizations,
a second mark provided on the first electrode face, and
a third mark provided on the second electrode face, the third mark differing from the second mark,
wherein the first mark provided on the outer surface of the bonding region has a shape that matches a shape of the second mark on the first electrode face of the piezoelectric element when the piezoelectric body is bonded to the prescribed bonding region on the outer surface so that the third mark on the second electrode face contacts the outer surface; and
the second and third marks are formed of two straight lines that extend in directions intersecting each other.

2. The scanner unit according to claim 1, wherein the second and third marks provided on the first and second electrode faces, respectively, have different colors from each other.

3. A scanner unit according to claim 1, wherein the second and third marks provided on the first and second electrode faces, respectively, have different shapes from each other.

4. The scanner unit according to claim 1, wherein
the first and second electrode faces are rectangular, and
the two straight lines are respectively parallel to a length direction and a width direction of each of the first and second electrode faces.

5. The scanner unit according to claim 1, wherein
the first and second electrode faces are rectangular, and
the two straight lines are diagonal lines that join the corners of each of the first and second electrode faces.

6. The scanner unit according to claim 1, wherein the ends of the two straight lines each contact an edge of each of the first and second electrode faces.

7. An optical fiber scanner comprising:
the scanner unit according to claim 1; and
an optical fiber that is inserted in the longitudinal direction inside the elastic part.

8. An illumination apparatus comprising:
an optical fiber scanner according to claim 7;
a light source that is disposed at a base end of the optical fiber scanner and that supplies illumination light to the optical fiber;
an illumination lens that is disposed at the distal end of the optical fiber scanner and that focuses light emitted from the distal end of the optical fiber onto a subject; and
a long, thin outer tube that accommodates the optical fiber scanner and the illumination lens.

9. An observation apparatus comprising:
an illumination apparatus according to claim 8; and
a light detecting portion that detects return light returning from the subject in response to the subject being irradiated with light by the illumination apparatus.

10. The scanner unit according to claim 1, wherein the first mark extends from an inside of the prescribed bonding region to an outside of the prescribed bonding region.

11. The scanner unit according to claim 1, wherein first mark comprises one or more lines that pass through a center of the tubular elastic part; and the two straight lines of the second mark and third mark pass through a center of the piezoelectric element.

* * * * *